United States Patent
Jones

(10) Patent No.: US 9,060,213 B2
(45) Date of Patent: Jun. 16, 2015

(54) BATTERY MONITORING SYSTEM

(75) Inventor: Lawrence A. Jones, Las Vegas, NV (US)

(73) Assignee: Spireon, Inc., Knoxville, TN (US)

( * ) Notice: Subject to any disclaimer, the term of this patent is extended or adjusted under 35 U.S.C. 154(b) by 152 days.

(21) Appl. No.: 13/479,403

(22) Filed: May 24, 2012

(65) Prior Publication Data

US 2012/0299721 A1 Nov. 29, 2012

Related U.S. Application Data

(60) Provisional application No. 61/489,347, filed on May 24, 2011, provisional application No. 61/489,520, filed on May 24, 2011.

(51) Int. Cl.
| | |
|---|---|
| *B60R 25/10* | (2013.01) |
| *H04Q 9/00* | (2006.01) |
| *B60R 25/33* | (2013.01) |
| *G01R 31/36* | (2006.01) |
| *H01M 10/42* | (2006.01) |
| *H01M 10/48* | (2006.01) |
| *B60R 25/102* | (2013.01) |
| *B60R 25/30* | (2013.01) |
| *B60R 25/00* | (2013.01) |

(52) U.S. Cl.
CPC . *H04Q 9/00* (2013.01); *B60R 25/10* (2013.01); *B60R 25/102* (2013.01); *B60R 25/30* (2013.01); *B60R 25/00* (2013.01); *B60R 25/33* (2013.01); *G01R 31/362* (2013.01); *G01R 31/3655* (2013.01); *G01R 31/3689* (2013.01); *H04Q 2209/823* (2013.01); *H01M 10/425* (2013.01); *H01M 10/48* (2013.01); *H01M 2010/4271* (2013.01); *H01M 2010/4278* (2013.01)

(58) Field of Classification Search
CPC ........ B60R 25/00; B60R 25/30; B60R 25/33; B60R 25/10; B60R 25/102; G01R 31/3689
USPC ............. 340/568.1, 571, 572.1, 572.8, 539.1, 340/539.32, 426.19, 521
See application file for complete search history.

(56) References Cited

U.S. PATENT DOCUMENTS

| | | | |
|---|---|---|---|
| 7,283,047 B2 * | 10/2007 | Culpepper et al. | ....... 340/539.13 |
| 7,502,672 B1 | 3/2009 | Kolls | |
| 2002/0105443 A1 | 8/2002 | Flick | |
| 2006/0212194 A1 | 9/2006 | Breed | |

(Continued)

OTHER PUBLICATIONS

International Searching Authority; International Search Report (2 pages) received Aug. 23, 2012.

*Primary Examiner* — Andrew Bee

(74) *Attorney, Agent, or Firm* — Luedeka Neely Group, P.C.

(57) ABSTRACT

A battery monitoring device attached to a vehicle battery includes a battery voltage sensor, motion sensor, location determination module, memory device, wireless modem, and controller. The battery voltage sensor senses the voltage level of the vehicle battery, the motion sensor senses movement of the battery monitoring device, and the location determination module determines the location of the battery monitoring device. The memory device stores a unique identification number associated with the battery monitoring device. Upon detection of an event as indicated by the battery voltage signal or the motion signal or the location information, the wireless modem transmits an alert message that includes the unique identification number and information regarding the event. The components of the device may be encapsulated in a potting compound within a cavity on the battery housing, or they may be enclosed in a housing that is separable from the battery housing.

21 Claims, 5 Drawing Sheets

(56) References Cited

U.S. PATENT DOCUMENTS

| | | | |
|---|---|---|---|
| 2009/0027056 A1* | 1/2009 | Huang et al. | 324/439 |
| 2010/0189302 A1* | 7/2010 | Chamberlain | 381/375 |
| 2011/0082621 A1 | 4/2011 | Berkobin et al. | |
| 2012/0038473 A1* | 2/2012 | Fecher | 340/455 |

\* cited by examiner

BATTERY MONITORING SYSTEM

RELATED APPLICATIONS

This application claims priority to U.S. provisional patent application Ser. Nos. 61/489,347 and 61/489,520, both filed May 24, 2011, the contents of which are incorporated herein by reference.

FIELD OF THE DISCLOSURE

The field of the disclosure is related to monitoring devices integrated into batteries used in motorized personal vehicles, such as motorcycles, all-terrain vehicles, snowmobiles and personal watercraft.

BACKGROUND

Batteries used on personal motorized vehicles, such as motorcycles, all-terrain vehicles, snowmobiles and personal watercraft, are often exposed to harsh environments that are detrimental to the electrical health of these batteries. It is important to the owners of such vehicles to maintain the health of the batteries so they are always ready to provide power for starting the vehicles. In most instances, vehicle owners first learn of battery problems when attempting to start their vehicles at times when it is inconvenient to deal with the problem. It is preferable to have advance warning that battery health is declining so the problem can be addressed at a time convenient to the owner.

Also, theft of batteries and theft of and other unauthorized use of personal motorized vehicles is an ongoing problem. Although security cables, chains, and locks have long been used in attempts to secure personal vehicles from theft, most such measures can be easily thwarted by a thief using a heavy-duty bolt cutter. Also, theft of batteries from such vehicles is usually not difficult.

What is needed is a monitoring device attached to or integrated into the battery of a personal vehicle that can detect and report (1) when the battery health is diminishing, (2) when there is unauthorized movement of the battery, thereby indicating either theft of the battery or unauthorized movement of the vehicle, and (3) the location of the battery after a theft or unauthorized movement event.

SUMMARY OF THE INVENTION

The above and other needs are met by a battery monitoring device configured to be attached to a housing of a vehicle battery. In a preferred embodiment, the battery monitoring device includes a battery voltage sensor, a motion sensor, a location determination module, a memory device, a wireless modem, and a controller. The battery voltage sensor senses the voltage level of the vehicle battery and generates a battery voltage signal based thereon. The motion sensor senses movement of the battery monitoring device and generates a motion signal based on the movement. The location determination module determines the location of the battery monitoring device and generates location information based on the location. The memory device stores at least a unique identification number associated with the battery monitoring device. The wireless modem transmits an alert message from the battery monitoring device. The controller receives the battery voltage signal, the motion signal and the location information, and generates the alert message based on an event indicated by one or more of the battery voltage signal, the motion signal and the location information. The alert message includes at least the unique identification number and information regarding the event.

In some embodiments, the battery voltage sensor, motion sensor, location determination module, memory device, wireless modem and controller are encapsulated in a potting compound within a cavity on the housing of the vehicle battery.

In some embodiments, the battery voltage sensor, motion sensor, location determination module, memory device, wireless modem and controller are disposed within a monitoring device housing that is separable from the housing of the vehicle battery. The electrical connection between the battery monitoring device and the vehicle battery terminals is accomplished when the monitoring device housing is attached to the battery housing.

In some embodiments, the controller generates the alert message when the motion signal indicates a movement event, or when the battery voltage signal indicates that the voltage of the battery has dropped below a predetermined threshold, or when the location information indicates a change of location event.

In another aspect, the invention is directed to a battery monitoring system that includes a battery monitoring device as described above and a service provider server computer that is in communication with a wireless communication network and a wide area communication network. The service provider server computer receives the alert message transmitted from the battery monitoring device via the wide area communication network or the wireless communication network. Based on the alert message, the service provider computer generates an alert notification that includes information regarding the event. The service provider computer sends the alert notification to a customer who is associated with the battery monitoring device that transmitted the alert message.

In some embodiments, the battery monitoring system includes a customer database that is accessible by the service provider server computer. The customer database stores a plurality of unique identification numbers of a plurality of battery monitoring devices in association with customer information. The service provider server computer accesses the customer information from the customer database and, based on the unique identification number in the alert message, identifies the customer who is associated with the battery monitoring device that transmitted the alert message.

In yet another aspect, the invention is directed to a method for monitoring a vehicle battery using a battery monitoring device attached to the vehicle battery. In a preferred embodiment, the method includes the following steps:

(a) activating the battery monitoring device;
(b) sensing a voltage level of the vehicle battery and generating a battery voltage signal based on the voltage level;
(c) sensing movement of the battery monitoring device and generating a motion signal based on the movement;
(d) determining a location of the battery monitoring device and generating location information based on the location;
(e) determining that an event has occurred based on one or more of:
  a drop in battery voltage level below a predetermined threshold level as indicated by the battery voltage signal;
  movement of the battery monitoring device as indicated by the motion signal; and
  a change in location of the battery monitoring device as indicated by the location information;
(f) generating an alert message based on the event, where the alert message includes a unique identification number associated with the battery monitoring device and information regarding the event; and (g) wirelessly transmitting the alert message from the battery monitoring device.

In some embodiments, the alert message transmitted in step (g) includes location coordinates of the battery monitoring device, and/or information indicating that the battery voltage level is below the predetermined threshold, and/or information indicating movement of the battery monitoring device.

BRIEF DESCRIPTION OF THE DRAWINGS

Further features, aspects, and advantages of the present disclosure will become better understood by reference to the following detailed description, appended claims, and accompanying figures, wherein elements are not to scale so as to more clearly show the details, wherein like reference numbers indicate like elements throughout the several views, and wherein:

DETAILED DESCRIPTION

Figure 1:
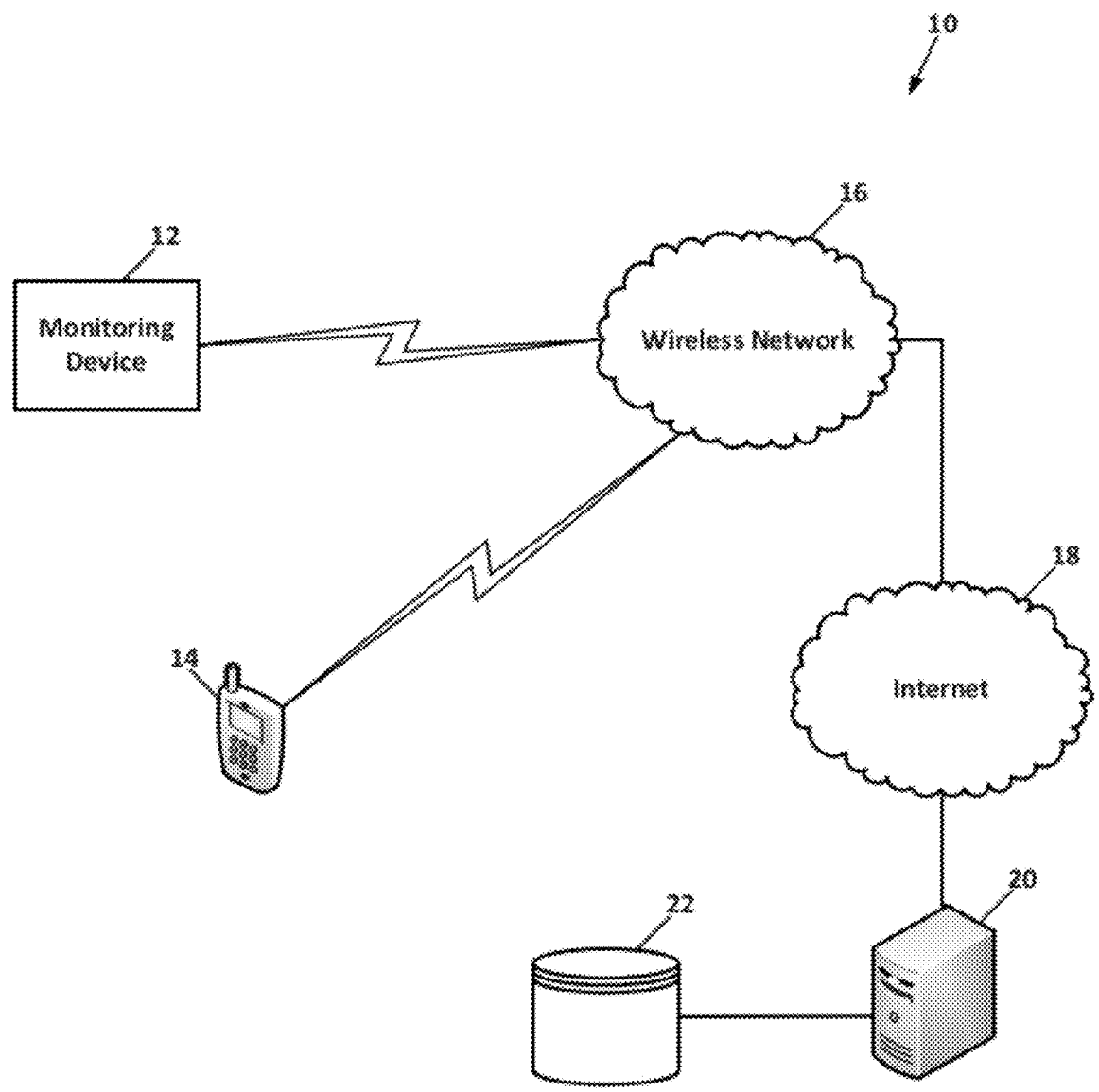
FIG. 1 depicts a functional block diagram of a battery monitoring system according to an embodiment of the invention.

As shown in FIG. 1, a battery monitoring system 10 includes a battery monitoring device 12 in wireless communication with a wireless network 16, such as a cellular communication network or WiFi network, connected to a wide area communication network 18, such as the Internet. A customer mobile communication device 14, such as a smart phone or tablet computer, is also in wireless communication with the wireless network 16. A service provider server computer 20 is in communication with the wide area communication network 18. A customer database 22 is accessible to the service provider server computer 20.

Figure 2:
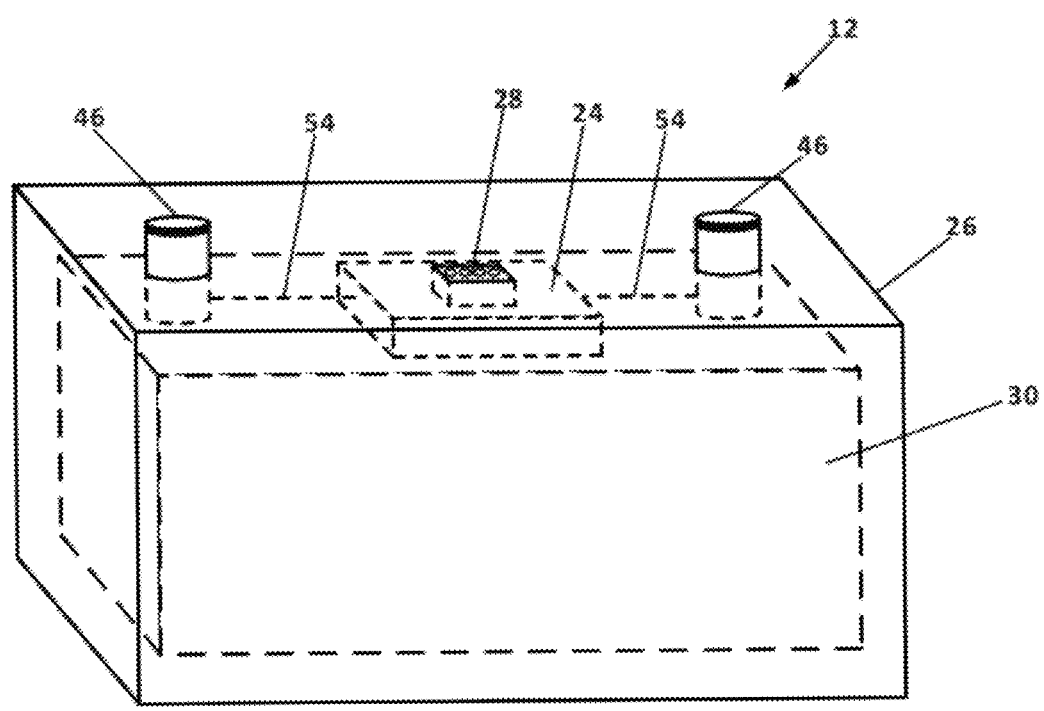
FIG. 2 depicts components of a battery monitoring device according to an embodiment of the invention.
Figure 3:
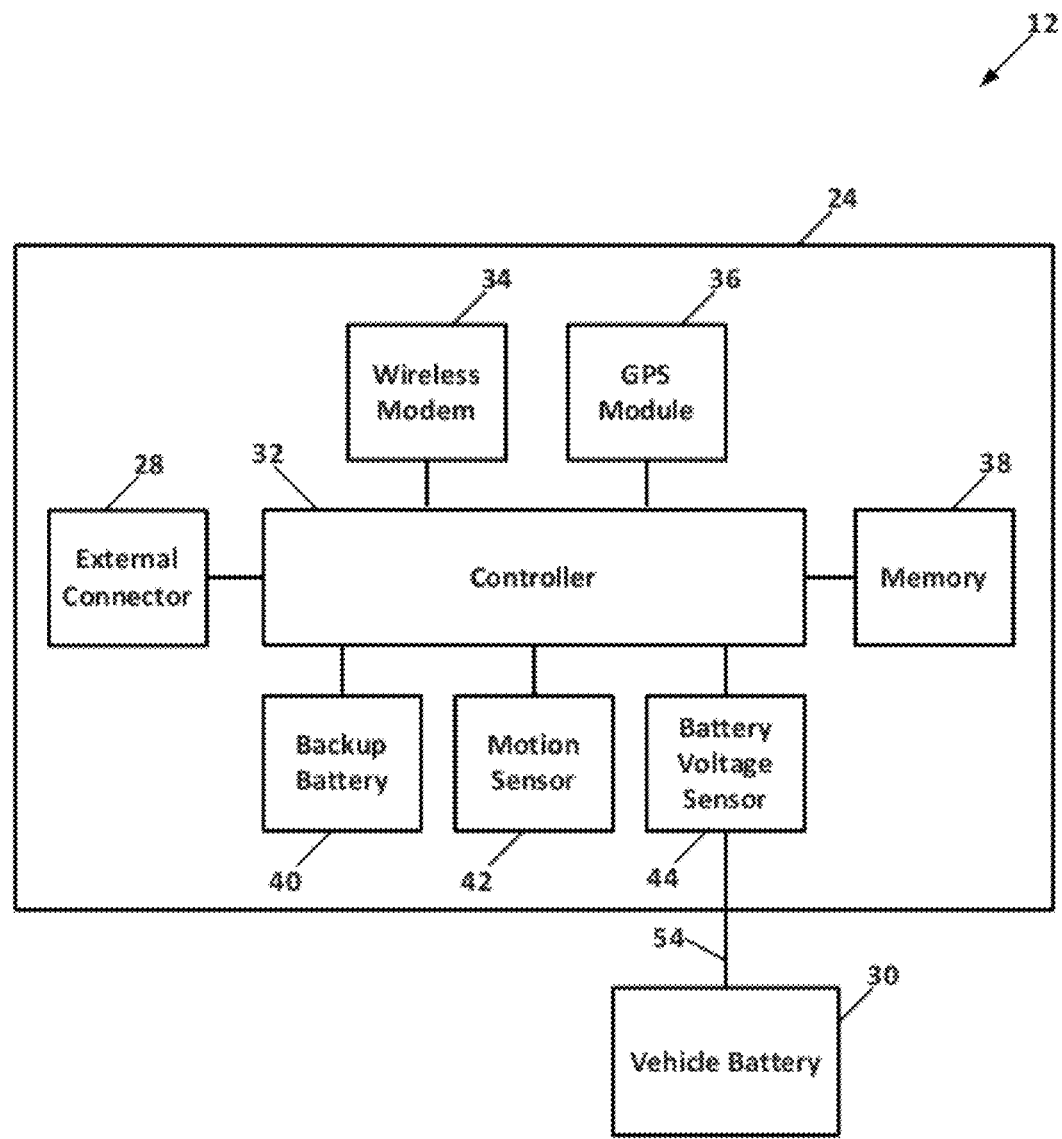
FIG. 3 depicts a functional block diagram of a battery monitoring device according to an embodiment of the invention.

FIG. 2 depicts the physical configuration of one embodiment of the battery monitoring device 12. The monitoring device 12 of this embodiment integrates an electronics module 24 into the housing 26 of a vehicle battery 30 having positive/negative battery terminals 46. Preferably, the electronics module 24 is encased in a potting compound within a cavity in an upper portion of the housing 26, thereby making the module 24 impervious to moisture and other environmental elements. The embodiment of FIG. 2 includes an externally-accessible interface connector 28 which may be a 4-pin connector electrically connected to a 4-port input/output interface of a microprocessor controller 32 (FIG. 3). The battery 30 is preferably a 12-volt battery such as is typically used on motorcycles, scooters, mopeds, all-terrain vehicles, snowmobiles, personal watercraft, and other motorized vehicles. Such vehicles are referred to herein as "personal vehicles."

As shown in FIG. 3, a preferred embodiment of the electronics module 24 includes the microprocessor controller 32, a wireless modem 34, a location determination module 36, a memory module 38, a backup battery 40, a motion sensor 42, a battery voltage level sensor 32, and the interface connector 28. Power for the electronics module 24 is provided by the vehicle battery 30. Alternatively, such as when the vehicle battery 30 is dead, power for the module 24 may be provided by the backup battery 40, which may be a lithium ion battery or other type battery commonly used in cellular telephones.

As described in more detail hereinafter, the microprocessor controller 32 is operable to execute firmware instructions to monitor signals from the motion sensor 42 and the battery voltage sensor 32, to receive location coordinates from the location determination module 36, to send and receive messages via the wireless modem 34, and to access the memory 38. The wireless modem 34 is preferably a cellular or satellite transceiver. The location determination module 36 is preferably a Global Positioning System (GPS) module, but could be implemented using other location determination technologies, such as based on proximity to cellular towers. The motion sensor 42, such as a single-axis or multi-axis accelerometer, generates signals based on motion of the monitoring device 12. The battery voltage sensor 32 is a circuit for sensing the voltage across the terminals 34 of the battery 30. The memory module 38 may be a SIM card, flash memory card, or other type of memory device.

Figure 4:
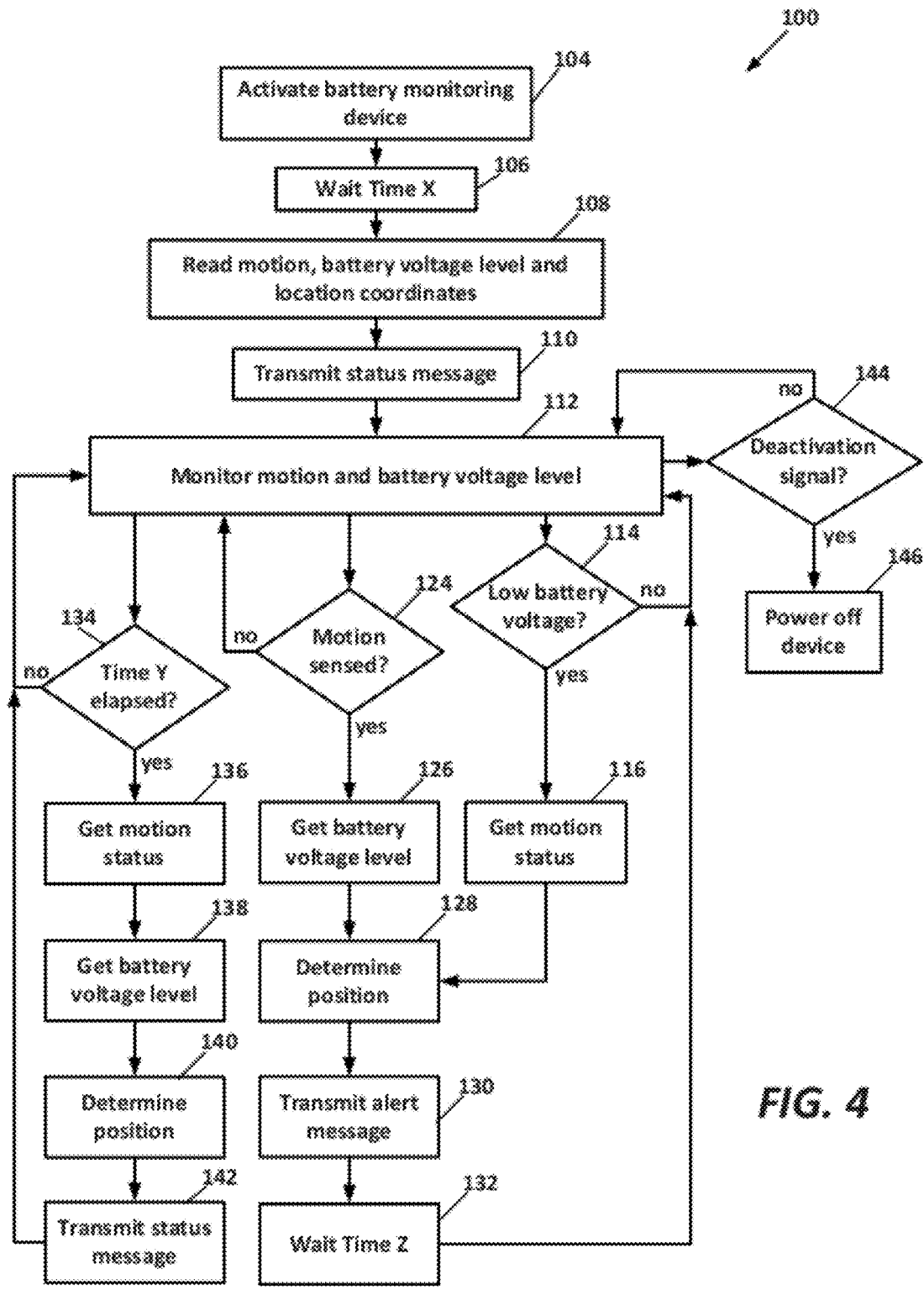
FIG. 4 depicts a process for operating a battery monitoring device according to an embodiment of the invention.

FIG. 4 depicts a preferred embodiment of a process 100 for operating the battery monitoring device 12 based on firmware instructions executed by the microprocessor controller 32. The monitoring device may be activated (step 104) in various different ways. In one embodiment, the device 12 is activated by the customer, or by an installer acting on behalf of the customer, once the battery 30 with the integrated monitoring device 12 has been installed in the vehicle. This may be accomplished by sending an electronic message from the customer mobile communication device 14 (or other communication device) to the service provider computer 20 via the wireless network 16 and Internet 18. The electronic message may be an SMS text message or an email message which includes the serial number (i.e., cell phone number) of the monitoring device 12 along with the text word "activate" or some other word or code that the service provider computer 20 recognizes as an activation request. In response to the activation request, the service provider computer 20 sends an activation command to the monitoring device 12 via the Internet 18 and the wireless network 16. The monitoring device 12, which up to this point has been in a low-power sleep mode, receives the activation command and powers up.

In another embodiment, the monitoring device 12 may be activated by entering the device serial number and activation request via a website operated by the service provider for this purpose. Upon receipt of the activation request via the website, the activation command is sent from the service provider computer 20 as described above.

In another embodiment, the monitoring device 12 may be activated when the battery voltage sensor 44 senses that the terminals 46 of the battery 30 have been connected to a load in the vehicle. For example, when the battery terminals 46 are initially connected to the vehicle's battery cables during installation, the vehicle begins drawing power from the battery 30. This causes current to be drawn from the battery which the sensor 44 detects as a change in voltage across the terminals 46. Alternatively, a current sensor may be included in the device 12 for this purpose. The sensor 44 provides a corresponding signal to the controller 32 which the controller 32 interprets as an initial installation signal. The controller 32 then powers up the device to begin monitoring.

In another embodiment, when the monitoring device 12 is initially shipped from the manufacturer, a "pre-installation" plug is plugged into to the 4-pin connector 28. This pre-installation plug shorts together two or more of the pins of the connector 28. When the monitoring device 12 is installed in the vehicle, the pre-installation plug is removed which breaks the electrical connection that was shorting together the pins of the connector 28. The controller 32 interprets this change as an initial installation signal. The controller 32 then powers up the device to begin monitoring.

In another embodiment, during installation, the installer connects an input/control device to the connector 28. The input/control device includes a manually-operated switch which may be used to generate an initial installation signal. Upon detection of this signal, the controller 32 powers up the device to begin monitoring.

After a time delay (such as 20 seconds) to allow motion of the vehicle to settle down, the controller 32 reads the state of the motion sensor 42 and the battery voltage sensor 44, and gets location coordinates from the GPS module 36. Data from these sensors is written to a status message that is transmitted from the wireless modem 34 (step 110).

In one preferred embodiment, once the monitoring device 12 has been activated, the controller 32 continues to monitor output signals from the motion sensor 42 and the battery voltage sensor 44 (step 112). The GPS module 36 and the wireless modem 34 are preferably powered down at this point to preserve battery life. As long as the battery voltage sensor 44 indicates that the battery voltage level is above some minimum threshold (step 114) and the motion sensor 42 senses no motion (step 124), no alert messages are generated and the controller 32 continues monitoring the sensors 42 and 44 (step 112).

If the battery voltage sensor 44 detects that the battery voltage level has dropped below a minimum threshold (such as 11 volts)(step 114) indicating that the battery 30 is failing to hold a charge, the controller 32 reads the state of the motion sensor 42 (step 116) and activates the GPS module 36 to take a position reading (step 128). The controller 32 then generates an alert message containing a battery level status indicator (low voltage), a motion status indicator (moving or stationary), a time stamp, and position coordinates from the GPS module 36, and transmits the alert message via the wireless modem 34 (step 130). The controller 32 then waits some predetermined time (step 132), such as one minute, and repeats the process starting at step 112.

If the motion sensor 42 detects movement of the monitoring device 12 (step 124), such as may occur when someone tries to forcibly removed the device 12 from the personal vehicle, or otherwise move the vehicle, the controller 32 reads the state of the battery voltage level sensor 44 (step 126) and activates the GPS module 36 to take a position reading (step 128). The controller 32 then generates an alert message containing the battery voltage status indicator, the motion status indicator, position coordinates from the GPS module 36, a time stamp, and the identification number of the monitoring device 12 (which may be the phone number or serial number of the wireless modem 34), and transmits the alert message via the wireless modem 34 (step 130). The controller 32 then waits some predetermined time (step 132), such as one minute, and repeats the process starting at step 112.

In a preferred embodiment, the monitoring device 12 periodically performs a status check and transmits a corresponding status message, even when no movement is sensed by the motion sensor 42 and no low battery condition has been detected. As shown in FIG. 4, after a predetermined time has elapsed since the device was activated or since a previous status check, such as two hours (step 134), the controller 32 reads the state of the motion sensor 42 (step 136), reads the state of the battery voltage level sensor 44 (step 138) and activates the GPS module 36 to take a position reading (step 140). The controller 32 then generates a status message containing the battery voltage level status indicator, the motion status indicator, position coordinates from the GPS module 36, a time stamp, and the identification number of the security device 12, and transmits the status message via the wireless modem 34 (step 142). This process repeats after the predetermined time has elapsed since the previous status message transmission (steps 134-142).

If the position coordinates determined during one of the periodic status checks are different from the position coordinates determined during a prior status check, the controller 32 generates an alert message indicating that the monitoring device 12 has moved even though no movement has been sensed by the motion sensor 42. Although this is an unlikely scenario, it is possible that it could occur if the motion sensor 42 has either malfunctioned or the controller 32 has been programmed to ignore signals from the motion sensor 42.

In a preferred embodiment, as long as the device 12 is activated, the controller 32 continues monitoring the sensors 44 and 42 (step 112) and doing periodic status checks. The device 12 may be deactivated (step 144) using techniques similar to those described above for initial activation. For example, the device 12 may be deactivated by (1) sending an electronic message (text or email) containing the word "deactivate" from the customer mobile communication device 12, (2) choosing a deactivate option at a website provided by the service provider, (3) connecting a "deactivation plug" to the 4-pin connector 28, or (4) plugging a control device into the 4-pin connector 28 and using a switch to generate a deactivation signal. When deactivated, the controller 32 powers down the device 12 and goes into a sleep mode (step 146).

Depending on the particular personal vehicle application, the monitoring device 12 may be programmed differently than described above to accommodate situations that are specific to the particular type of personal vehicle. For example, when the monitoring device 12 is installed in a floating personal watercraft secured to a dock or mooring, monitoring of the motion sensor 42 may be disabled to avoid false alarms caused by normal wave motion. Alternatively, the controller 32 may be programmed to generate an alert message only if the acceleration or velocity sensed by the motion sensor 42 indicates that the personal watercraft is moving away from its mooring or is operating under power. These and other programming options may be selected using electronic messages sent from the customer mobile communication device 14 (or other Internet-connected computer) to the service provider computer 20 and relayed to the device 12 via the wireless network 16, or a control text message may be sent from the customer mobile communication device 14 directly to the monitoring device 12 via the wireless network 16.

With reference to FIG. 1, status and alert transmissions from the monitoring device 12 are communicated through the wireless network 16 and the Internet 18 to the service provider server 20 where the messages are processed. Using the identification number of the monitoring device 12 contained in the status or alert message, the server 20 accesses the customer database 22 and determines the contact information for the customer associated with the identification number. The server 20 then generates a status or alert notification and sends the notification to the customer using the customer's preferred mode of communication, such as via email, text message or instant message. Preferably the status and alert notifications generated by the server 20 will include information provided in the message transmitted from the device 12, including battery status, motion status, position coordinates and time stamp. Alert notifications will also preferably include an indication of what triggered the alert, which would be either a battery low-voltage condition, movement of the device 12, or a change in position coordinates detected during a periodic status check. The status and alert notifications may be communicated via the Internet 18 and wireless network to the customer mobile communication device 14 or other device as indicated by the customer's preferences stored in the customer database 22.

In one embodiment of the invention, the monitoring device 12 may be operated in a travel mapping mode wherein location data from the position determination module 36 is logged at predetermined time intervals (e.g., every 60 seconds) during a trip, so that a customer can later download the stored location data of a trip in a travel map file. The travel map file can be uploaded, for example, to a mapping software suite in the customer mobile communication device 14 or other computing device to provide a visual representation of where the monitoring device 12 has traveled while travel mapping mode was activated. The software suite can be proprietary and/or can be compatible with other mapping applications such as, for example, Google® Maps. The data from a travel mapping mode session can be saved, for example, in the memory module 38, on the server 20, in the customer database 22 or other storage location. In one embodiment, the travel map file data may transferred from the monitoring device 12 using, for example, a USB cable or the like connected to a data interface on the device 12, such as a the connector 28. In a related embodiment, the travel map data may be transferred wirelessly from the security device 12 using the wireless modem 34.

In some embodiments, a software application is provided for the customer mobile communication device 14 to enable communication between the device 14 and the service provider server 20 via the Internet 18. Using the software application, the customer may interact with the server 20 to cause the server 20 to send control messages to the monitoring device 12 to change its operational settings. For example, the customer may use the software application to remotely (1) activate and deactivate the monitoring device, (2) initiate a status check and transmission of a status message, (3) program the controller 32 to ignore motion sensor signals (as in the example discussed above) and/or to ignore location coordinate changes, (4) remotely configure the data logging intervals (for example, when in travel mapping mode), such as 10, 30, or 60 second intervals, (5) enable the sending of status messages upon the occurrence of certain events, such as arrival at or departure from certain locations, landmarks, or zone of compliance, or exceeding some threshold of miles traveled, (6) change the various power modes of the device from full power to power saver (sleep) mode. In addition to using the software application on the customer mobile device 14, in some embodiments the user may access a webpage to control settings of the monitoring device 12 and to see a map showing the current location of the monitoring device 12.

Figure 5:
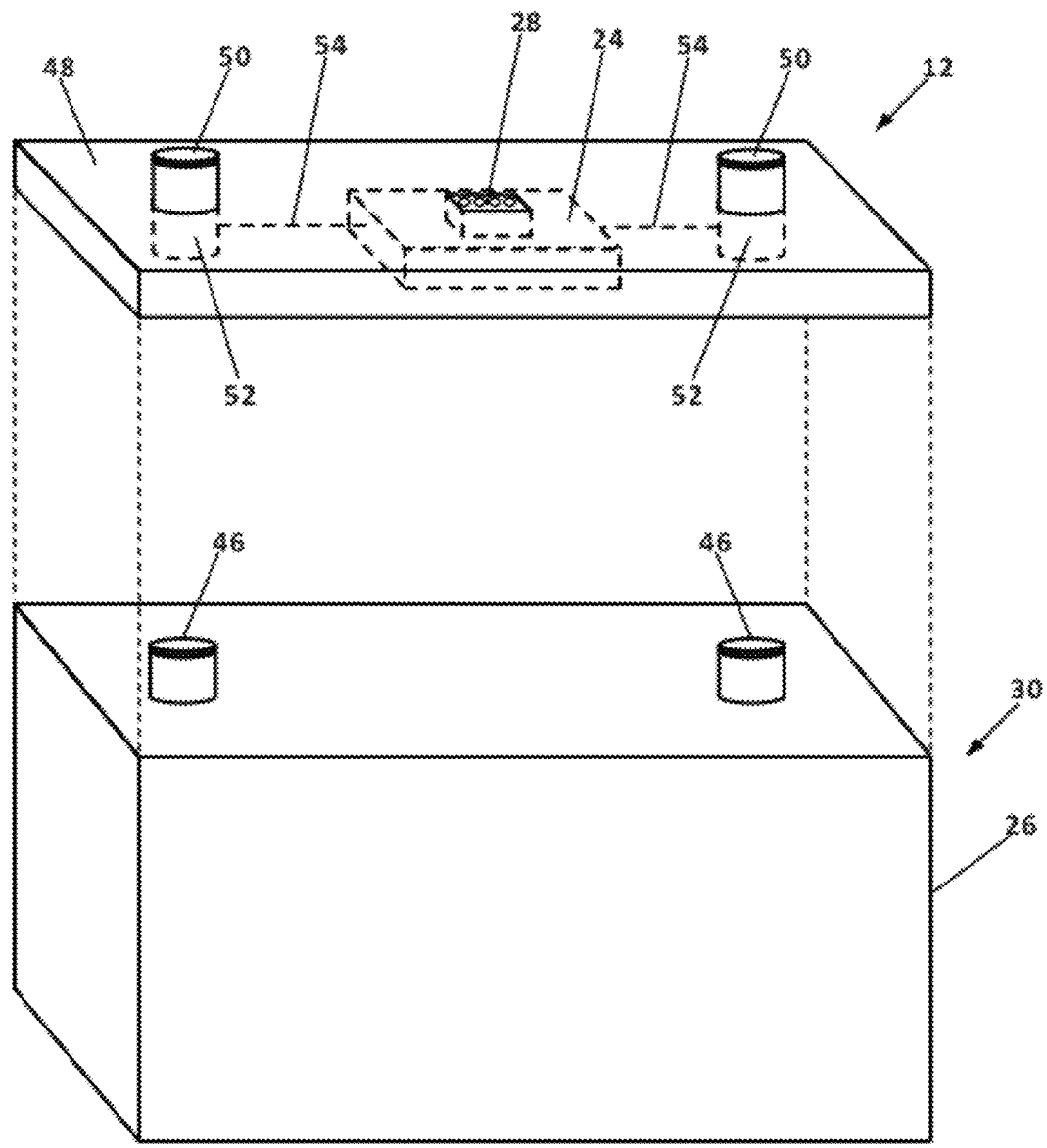
FIG. 5 depicts components of a battery monitoring device according to an alternative embodiment of the invention.

FIG. 5 depicts an embodiment wherein the battery monitoring device 12 includes a housing 48 that is separate from the housing 26 of the vehicle battery 30. With this embodiment, the monitoring device 12 may be attached to any vehicle battery to provide the monitoring functions described herein. Preferably, the electronics module 24 is embedded in the housing 48 and may be encased in a potting compound for environmental protection. As with previously described embodiments, electrical power for the monitoring device 12 is provided by the vehicle battery 30. The housing 48 preferably includes a pair of recesses 52 that are aligned with the battery terminals 46 of the vehicle battery 30. When the monitoring device 12 is attached to the battery 30, the recesses 52 receive the battery posts 46. Within the recesses are electrical contacts connected to power lines 54 that electrically connect the electronics module 24 to the to the battery posts 46. In this embodiment, the monitoring device 12 includes a pair of posts 50 that electrically connect to the posts 46 when the posts 46 are received in the recesses 52. With this arrangement, the vehicle power cables may be connected to and receive battery power from the posts 50 when the monitoring device 12 is attached to the battery 30.

The foregoing description of preferred embodiments of the present disclosure has been presented for purposes of illustration and description. The described preferred embodiments are not intended to be exhaustive or to limit the scope of the disclosure to the precise form(s) disclosed. Obvious modifications or variations are possible in light of the above teachings. The embodiments are chosen and described in an effort to provide the best illustrations of the principles of the disclosure and its practical application, and to thereby enable one of ordinary skill in the art to utilize the concepts revealed in the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

What is claimed is:

1. A battery monitoring device for monitoring status of a vehicle battery having at least a pair of battery terminals, the battery monitoring device comprising:
   a housing having:
      means for physically attaching the housing to the vehicle battery;
      a pair of recesses disposed in the housing that are aligned with the pair of battery terminals for receiving the pair of battery terminals when the housing is physically attached to the vehicle battery; and
      a pair of electrical contacts, each associated with a corresponding one of the recesses and making electrical connection to one of the battery terminals based on the battery terminal being received in the recess;
   a pair of power lines for providing power to the battery monitoring device, the pair of power lines electrically connected to the pair of electrical contacts;
   a battery voltage sensor disposed in the housing for sensing a voltage level of the vehicle battery and generating a battery voltage signal based on the voltage level;
   a motion sensor disposed in the housing for sensing movement of the vehicle battery and generating a motion signal based on the movement;
   a location determination module disposed in the housing for determining a location of the vehicle battery and generating location information based on the location;
   a wireless modem disposed in the housing for transmitting an alert message from the battery monitoring device; and
   a controller disposed in the housing for receiving the battery voltage signal, the motion signal and the location information, and for generating the alert message based on an event indicated by one or more of the battery voltage signal, the motion signal and the location information.

2. The battery monitoring device of claim 1 wherein the housing includes a cavity and a potting compound disposed in the cavity, and wherein the battery voltage sensor, motion sensor, location determination module, memory device, wireless modem and controller are encapsulated in the potting compound.

3. The battery monitoring device of claim 1 wherein the controller generates the alert message when the motion signal indicates a movement event.

4. The battery monitoring device of claim 1 wherein the controller generates the alert message when the battery voltage signal indicates that the voltage of the battery has dropped below a predetermined threshold.

5. The battery monitoring device of claim 1 wherein the controller generates the alert message when the location information indicates a change of location event.

6. The battery monitoring device of claim 1 wherein
the controller periodically generates a status message that includes at least the location information, and
the wireless modem transmits the status message from the battery monitoring device.

7. The battery monitoring device of claim 1 further comprising:
a memory device disposed in the housing for storing at least a unique identification number associated with a customer of a battery monitoring service provider;
the controller for generating the alert message that includes at least the unique identification number and information regarding the event; and
a service provider server computer disposed remotely from the housing and in communication with one or more of a wireless communication network and a wide area communication network, the service provider server computer for receiving the alert message from the wide area communication network or the wireless communication network, for generating an alert notification based on the alert message, where the alert notification includes at least information regarding the event, and for sending the alert notification to the customer who is associated with the unique identification number.

8. The battery monitoring device of claim 7 further comprising:
a customer database accessible by the service provider server computer, the customer database for storing a plurality of unique identification numbers of a plurality of battery monitoring devices in association with customer information; and
the service provider server computer for accessing the customer information from the customer database and identifying the customer who is associated with the battery monitoring device that transmitted the alert message based on the unique identification number in the alert message.

9. The battery monitoring device of claim 8 wherein the service provider server computer accesses the customer information including one or more of an email address, phone number, and instant message address associated with the customer, and sends the alert notification to the customer via one or more of an email message, text message and instant message.

10. A method for monitoring a vehicle battery using a battery monitoring device comprising a housing configured to be physically attached to the vehicle battery, wherein the vehicle battery includes a pair of battery terminals and the housing includes a pair of recesses that are aligned with the pair of battery terminals, the recesses for receiving the battery terminals when the housing is physically attached to the vehicle battery, wherein the housing further includes electrical contacts associated with the recesses that make electrical connection to the battery terminals when the battery terminal are received in the recesses, wherein the battery monitoring device also includes a battery voltage sensor disposed in the housing, a motion sensor disposed in the housing, a location determination module disposed in the housing, a wireless modem disposed in the housing, and a controller disposed in the housing, the method comprising:
(a) installing the housing of the battery monitoring device onto the vehicle battery so that the pair of battery terminals are received into the pair of recesses in the housing and the electrical contacts associated with the recesses make electrical connection to the battery terminals to provide power to the battery monitoring device;
(b) activating the battery monitoring device;
(c) the battery voltage sensor sensing a voltage level of the vehicle battery and generating a battery voltage signal based on the voltage level;
(d) the motion sensor sensing movement of the vehicle battery and generating a motion signal based on the movement;
(e) the location determination module determining a location of the vehicle battery and generating location information based on the location;
(f) the controller determining that an event has occurred based on one or more of:
a drop in battery voltage level below a predetermined threshold level as indicated by the battery voltage signal;
movement of the battery monitoring device as indicated by the motion signal; and
a change in location of the battery monitoring device as indicated by the location information; and
(g) the controller generating an alert message based on the event, the alert message including at least a unique identification number associated with the battery monitoring device and information regarding the event; and
(h) the wireless modem wirelessly transmitting the alert message from the battery monitoring device.

11. The method of claim 10 wherein step (g) includes generating the alert message including the location information comprising location coordinates of the vehicle battery.

12. The method of claim 10 wherein step (g) includes generating the alert message including information indicating that the battery voltage level is below the predetermined threshold when so determined in step (f).

13. The method of claim 10 wherein step (g) includes generating the alert message including information indicating movement of the vehicle battery when so determined in step (f).

14. The method of claim 10 wherein step (g) includes generating the alert message including information indicating a change in location of the vehicle battery when so determined in step (f).

15. The method of claim 10 further comprising:
(i) the controller periodically generating a status message that includes at least the unique identification number and the location information; and
(j) the wireless modem wirelessly transmitting the status message from the battery monitoring device.

16. The method of claim 10 further comprising:
(i) communicating the alert message via one or more communication networks to a service provider server computer;
(j) the service provider computer operating on the alert message to extract therefrom at least the unique identification number and information regarding the event;
(k) accessing a customer database containing customer information stored in association with a plurality of unique identification numbers, each assigned to a corresponding battery monitoring device;

(l) determining customer information associated with the unique identification number extracted from the alert message;

(m) generating an alert notification containing at least the information regarding the event extracted from the alert message; and (n) sending the alert notification to a customer identified by the customer information associated with the unique identification number extracted from the alert message.

17. The method of claim 16 further comprising:
step (g) including generating the alert message including the location information; and (o) providing a webpage accessible to the customer on which a map is displayed with the location of the vehicle battery indicated thereon.

18. The method of claim 10 wherein step (b) includes sending an electronic message including an activation request from a customer mobile communication device.

19. The method of claim 10 wherein step (b) includes sending an activation request via a website provided by a service provider.

20. The method of claim 10 wherein the battery monitoring device includes an externally-accessible interface connector having at least two pins, and wherein step (b) includes removing a short between the at least two pins or inserting a short between the at least two pins to activate the battery monitoring device.

21. A battery monitoring device for monitoring status of a vehicle battery, the battery monitoring device comprising:

a housing having means for physically attaching the housing to the vehicle battery;

a battery voltage sensor disposed in the housing for sensing a voltage level of the vehicle battery and generating a battery voltage signal based on the voltage level;

a motion sensor disposed in the housing for sensing movement of the vehicle battery and generating a motion signal based on the movement;

a location determination module disposed in the housing for determining a location of the vehicle battery and generating location information based on the location;

a wireless modem disposed in the housing for transmitting an alert message from the battery monitoring device;

an externally-accessible interface connector disposed on the housing, the interface connector having at least two pins; and a controller disposed in the housing, the controller for monitoring an electrical connection state of the at least two pins of the interface connector and for causing activation of the battery monitoring device based on the electrical connection state of the at least two pins, the controller operable to receive the battery voltage signal, the motion signal and the location information, and generate the alert message based on an event indicated by one or more of the battery voltage signal, the motion signal and the location information.

* * * * *